United States Patent [19]
Itou

[11] Patent Number: 5,999,483
[45] Date of Patent: Dec. 7, 1999

[54] SEMICONDUCTOR CIRCUIT DEVICE OPERATING IN SYNCHRONIZATION WITH CLOCK SIGNAL

[75] Inventor: Takashi Itou, Hyogo, Japan

[73] Assignee: Mitsubishi Denki Kabushiki Kaisha, Tokyo, Japan

[21] Appl. No.: 09/116,886

[22] Filed: Jul. 16, 1998

[30] Foreign Application Priority Data

Jan. 26, 1998 [JP] Japan .................................. 10-012541

[51] Int. Cl.⁶ .................................................. G11C 8/00
[52] U.S. Cl. ...................................... 365/233; 365/230.08
[58] Field of Search .............................. 365/233, 189.05, 365/230.08, 185.21; 331/1, 57; 307/269

[56] References Cited

U.S. PATENT DOCUMENTS

| | | | |
|---|---|---|---|
| 4,736,119 | 4/1988 | Chen et al. ............................. | 307/269 |
| 5,157,354 | 10/1992 | Saiki et al. .................................. | 331/1 |
| 5,289,413 | 2/1994 | Tsuchida et al. ................... | 365/189.02 |
| 5,694,074 | 12/1997 | Kitade et al. ............................ | 327/390 |
| 5,708,603 | 1/1998 | Tanaka ................................ | 365/185.21 |
| 5,796,313 | 8/1998 | Eitan ......................................... | 331/57 |

FOREIGN PATENT DOCUMENTS 2-092019  3/1990  Japan .

*Primary Examiner*—David Nelms
*Assistant Examiner*—David Lam
*Attorney, Agent, or Firm*—McDermott, Will & Emery

[57] ABSTRACT

A synchronous DRAM includes a mode register, and a logic circuit controlling the drivability of a CMOS output buffer circuit in response to a signal which is set in the mode register. The output buffer circuit includes a plurality of P channel MOS transistors and an N channel MOS transistor. A signal which corresponds to the frequency of an external clock signal is set in the mode register. The logic circuit selectively turns on/off the plurality of P channel MOS transistors. When the frequency is low, the number of transistors which are turned on is reduced, and the drivability of the buffer circuit is lowered. Accordingly, a ringing phenomenon is suppressed.

15 Claims, 7 Drawing Sheets

FIG. 3
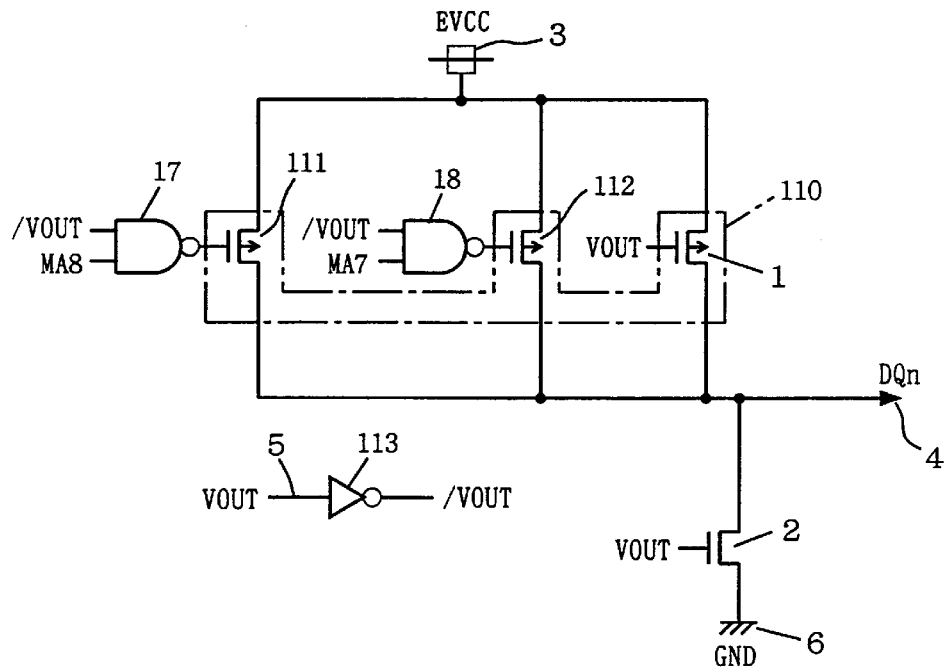
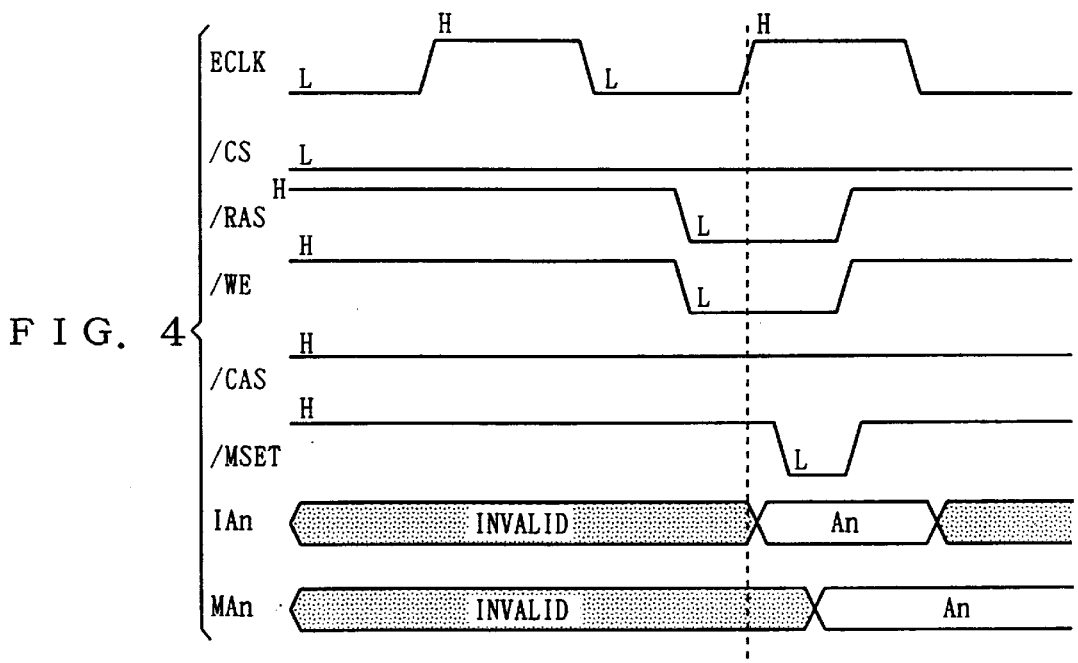
FIG. 4

SEMICONDUCTOR CIRCUIT DEVICE OPERATING IN SYNCHRONIZATION WITH CLOCK SIGNAL

BACKGROUND OF THE INVENTION

1. Field of the Invention

The present invention relates to a semiconductor circuit device and a method of using the same. More specifically, the present invention relates to a synchronous semiconductor memory device operating in synchronization with an external clock signal.

2. Description of the Background Art

A synchronous dynamic random access memory (hereinafter referred to as an "SDRAM") is one example of semiconductor circuit devices operating in synchronization with an external clock signal. A conventional SDRAM is provided with a CMOS type output buffer circuit as shown in FIG. 11.

Referring to FIG. 11, the output buffer circuit includes a P channel MOS transistor 1 and an N channel MOS transistor 2. P channel MOS transistor 1 is connected between an external power supply node 3 receiving an external power supply voltage EVCC and an output node 4 and has its gate connected to an input node 5. N channel MOS transistor 2 is connected between a ground node 6 receiving a ground voltage GND and output node 4 and has its gate connected to input node 5.

When an L (logic low) level output signal VOUT which was read out of a memory cell array is received at input node 5, P channel MOS transistor 1 and N channel MOS transistor 2 are turned on and off, respectively, and thus an H (logic high) level data signal DQn is output from output node 4.

On the other hand, when H level output signal VOUT is input to input node 5, P channel MOS transistor 1 and N channel MOS transistor 2 are turned off and on, respectively, and thus L level data signal DQn is output from output node 4.

Since an SDRAM is usually employed as a memory device for a computer system, external clock signals having various frequencies are input to the SDRAM according to the operating frequency of a CPU (Central Processing Unit). Therefore, the sizes of transistors 1 and 2 are usually so designed that the output buffer circuit can supply sufficient current when an external clock signal having a maximum frequency is input.

However, when the frequency of the external clock signal is low, the current supplying capability of the output buffer circuit becomes too high. Therefore, a ringing phenomenon has been caused before data signal DQn converges at the H or L level.

Although Japanese Patent Laying-Open No. 2-92019 discloses the technique of setting a mode register in accordance with the load of external circuitry connected to a terminal for outputting a data signal and changing the drivability of an output buffer circuit in accordance with the set mode register, the problem above cannot be solved since what is set in the mode register is a signal which corresponds to the "load" of the external circuitry.

SUMMARY OF THE INVENTION

An object of the present invention is to provide a semiconductor circuit device which prevents a ringing phenomenon even when the frequency of an external clock signal is low, and a method of using the same.

According to one aspect of the present invention, a semiconductor circuit device operating in synchronization with a clock signal includes an output buffer circuit and a control circuit. The output buffer circuit includes a transistor element outputting a data signal. The control circuit controls the output buffer circuit in accordance with the frequency of the clock signal to change the current supplying capability of the transistor element.

Preferably, the control circuit includes a register and a change circuit. A desired signal can be set in the register. The change circuit changes the current supplying capability of the transistor element in response to the signal which is set in the register.

More preferably, the transistor element includes a plurality of first conductivity type transistors connected in parallel between a first power supply node and the output node of the output buffer circuit. The change circuit includes an activation circuit selectively activating the plurality of first conductivity type transistors in response to the signal which is set in the register. The output buffer circuit further includes a second conductivity type transistor connected between a second power supply node and the output node.

Preferably, the control circuit includes a detection circuit and a change circuit. The detection circuit detects the frequency of the clock signal and outputs a control signal in accordance with the detected frequency. The change circuit changes the current supplying capability of the transistor element in response to the control signal which is output from the detection circuit.

More preferably, the transistor element includes a plurality of first conductivity type transistors connected in parallel between a first power supply node and the output node of the output buffer circuit. The change circuit includes an activation circuit selectively activating the plurality of first conductivity type transistors in response to the control signal which is output from the detection circuit. The output buffer circuit further includes a second conductivity type transistor connected between a second power supply node and the output node.

Preferably, the semiconductor circuit device further includes a down converter circuit down-converting an external power supply voltage to generate an internal power supply voltage. The transistor element includes a first P channel MOS transistor and a second P channel MOS transistor. The first P channel MOS transistor is connected between an external power supply node receiving the external power supply voltage and the output node of the output buffer. The second P channel MOS transistor is connected between an internal power supply node receiving the internal power supply voltage and the output node. The control circuit activates the first or second P channel MOS transistor in accordance with the frequency of the clock signal. The output buffer circuit further includes an N channel MOS transistor connected between a ground node and the output node.

According to another aspect of the present invention, a method of using a semiconductor circuit device operating in synchronization with a clock signal, the semiconductor circuit device including an output buffer circuit having a transistor element outputting a data signal, a register in which a desired signal can be set, and a change circuit changing the current supplying capability of the transistor element in response to a signal which is set in the register, includes the steps of setting the register into a mode in which a desired signal can to be set in the register and setting a signal which corresponds to the frequency of the clock signal in the register.

In the semiconductor circuit device, the current supplying capability of the transistor element in the output buffer circuit changes in accordance with the frequency of the clock signal. Therefore, when the frequency of the clock signal is low, the current supplying capability of the transistor element is also lowered and thus a ringing phenomenon becomes less possible.

When a desired signal is set in the register, the current supplying capability of the transistor element changes in response to the set signal. Therefore, when the frequency of the clock signal is low, the ringing phenomenon becomes less possible by setting a signal which corresponds to the low frequency in the register.

Further, a plurality of transistors connected in parallel between the power supply node and the output node are selectively activated in response to the signal which is set in the register. When the frequency of the clock signal is low, therefore, some of the plurality of transistors are activated by setting a signal which corresponds to the low frequency in the register, and thus the current supplying capability of the transistor element formed of the plurality of transistors is lowered.

Further, the frequency of the clock signal is detected, and the current supplying capability of the transistor elements changes in accordance with the detected frequency. Therefore, when the frequency of the clock signal is low, the current supplying capability of the transistor element is automatically lowered in accordance with the detected low frequency.

Further, the first or second P channel MOS transistor is activated in accordance with the frequency of the clock signal. When the frequency of the clock signal is low, therefore, the first P channel MOS transistor is inactivated and the second P channel MOS transistor is activated. Since the second P channel MOS transistor is connected to the internal power supply node, its current supplying capability comes to be lower than that of the first P channel MOS transistor connected to the external power supply node.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram showing structures of an output buffer circuit and its control circuitry included in the data input/output buffer shown in FIG. 1.

FIG. 4 is a timing chart illustrating the operation of the SDRAM shown in FIGS. 1–3.

DESCRIPTION OF THE PREFERRED EMBODIMENTS

Figure 1:
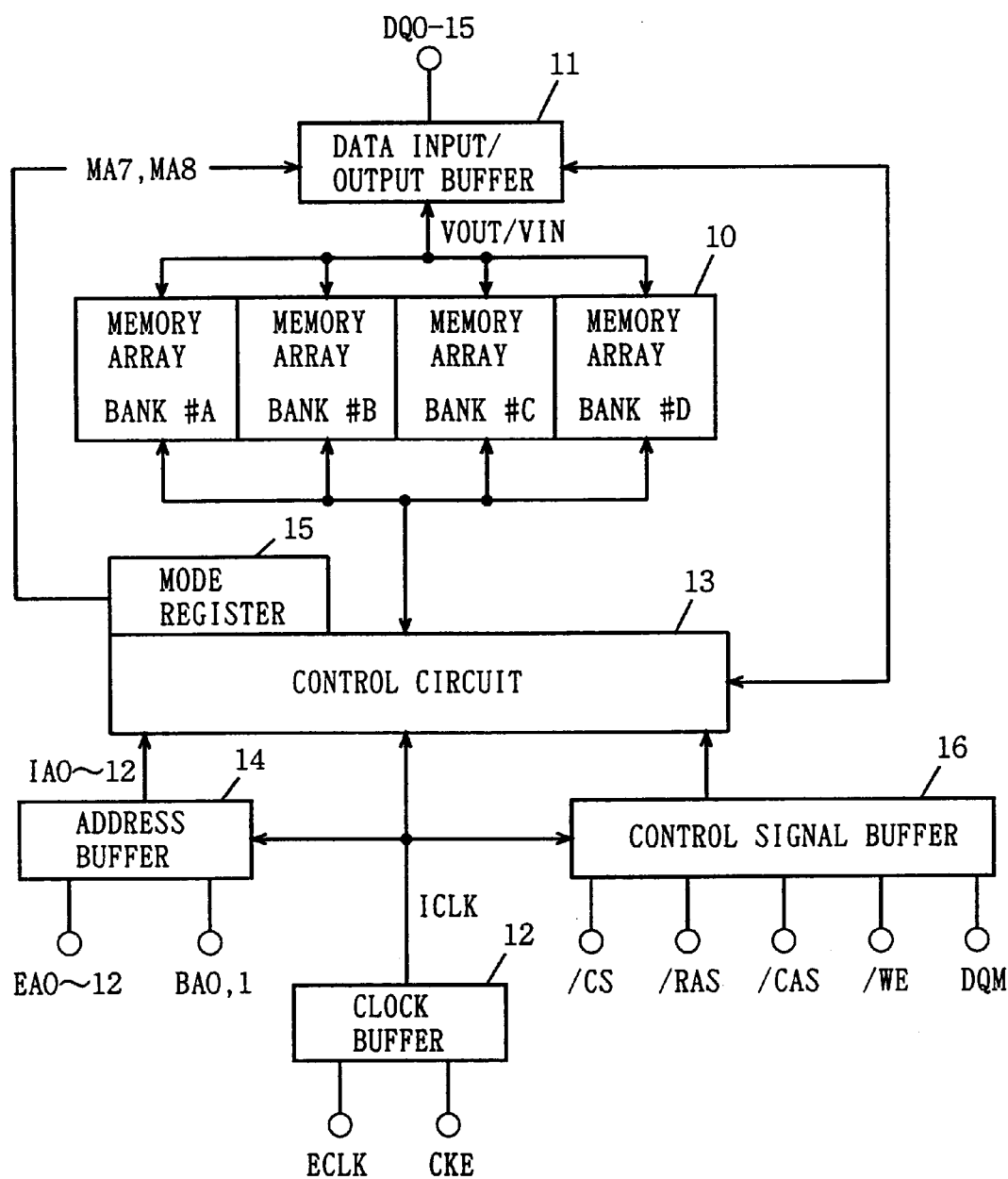
FIG. 1 is a block diagram showing an overall structure of a DRAM according to a first embodiment of the present invention.

Hereinafter, the embodiments of the present invention will be described in detail with reference to the drawings. Here, the same or corresponding parts throughout the drawings have the same reference characters and their descriptions will not be repeated.

[First Embodiment]

FIG. 1 is a block diagram showing an overall structure of a SDRAM according to a first embodiment of the present invention. Referring to FIG. 1, the SDRAM includes a memory cell array 10 formed of four banks #A, #B, #C, #D, a data input/output buffer 11 outputting an output signal VOUT read out of memory cell array 10 as data signals DQ0–DQ15 and writing data signals DQ0–DQ15, which are input, to memory cell array 10 as an input signal VIN, a clock buffer 12 activated in response to a clock enable signal CKE and outputting an external clock signal ECLK as an internal clock signal ICLK, and a control circuit 13 controlling-memory cell array 10 and data input/output buffer 11 in response to internal clock signal ICLK.

The SDRAM further includes-an address buffer 14 outputting external address signals EA0–EA12 as internal address signals IA0–IA12 and receiving bank selection signals BA0 and BA1, a mode register 15 capable of setting various operation modes, and a control signal buffer 16 generating various internal control signals in response to various external control signals (a chip selection signal /CS, a row address strobe signal /RAS, a column address strobe signal /CAS, a write enable signal /WE, an input/output data mask signal DQM).

When an external control signal is input at prescribed timing representing a command for setting mode register 15, the SDRAM enters a register setting mode, and control circuit 13 provides internal address signals IA0–IA12 supplied from address buffer 14 to mode register 15. Therefore, a desired signal can be set in mode register 15.

Figure 2:
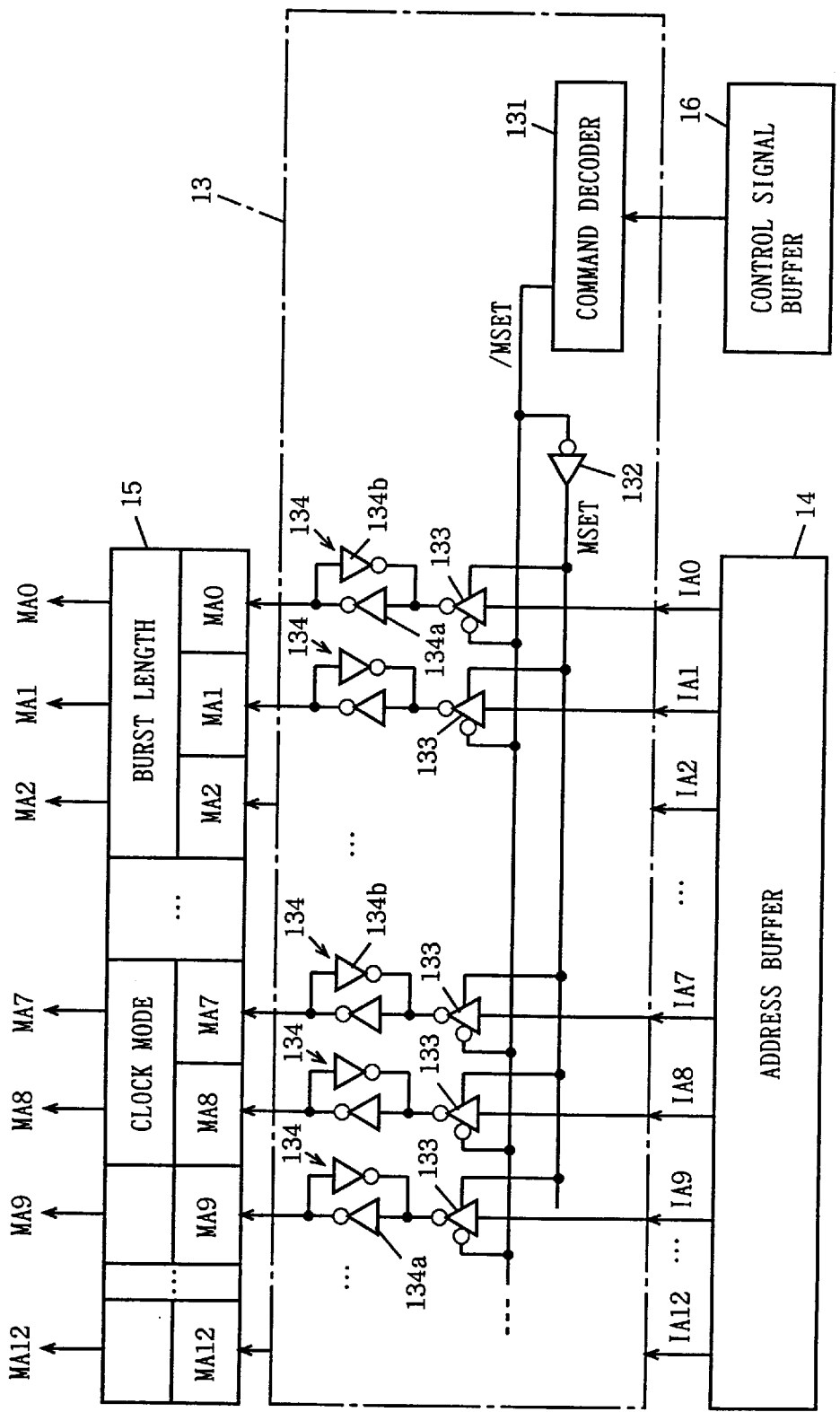
FIG. 2 is a circuit diagram showing structures of a main part of the control circuit and peripheral circuitry such as the mode register shown in FIG. 1.

As shown in FIG. 2, control circuit 13 includes a command decoder 131, an inverter 132, thirteen clocked inverters 133, and thirteen latch circuits 134.

Command decoder 131 decodes commands (represented by timing for inputting control signals /CS, /RAS, /CAS, /WE, DQM) which are received externally through control signal buffer 16 and outputs various control signals. When a control signal is input at prescribed timing representing a command for setting mode register 15, command decoder 131 activates a mode setting signal /MSET which is one of the output control signals to the L level. Mode setting signal /MSET is commonly supplied to thirteen clocked inverters 133, and a mode setting signal MSET (signal inverted with respect to mode setting signal /MSET) which is output from inverter 132 is also commonly supplied to thirteen clocked inverters 133.

Each clocked inverter 133 is activated when mode setting signals /MSET and MSET are at the L level and the H level, respectively, and the clocked inverter inverts a corresponding 1-bit signal of internal address signals IA0–IA12 supplied from address buffer 14 and transmits it to a corresponding latch circuit 134.

Each latch circuit 134 is formed of two inverters 134a, 134b. Each latch circuit 134 latches an inverted 1-bit internal address signal from a corresponding clocked inverter 133, and supplies the latched signal to a corresponding bit in mode register 15. Therefore, 13-bit internal address signals IA0–IA12 are set in mode register 15 as 13-bit mode address signals MA0–MA12.

Various operation modes can be set in mode register 15. Generally, mode address signals MA0–MA2 for determining a burst length is set in zeroth in second bits. Further, a mode address signal (not shown) for determining a burst type such as a sequential method or an interleave method is set in a third bit. In addition, mode address signals (not shown) for determining the latency of column address strobe signal /CAS are set in fourth to sixth bits.

Although the seventh and eighth bits of a typical mode register are not used, mode address signals MA7 and MA8 for determining a clock mode are set in the seventh and eighth bits of mode register 15 according to the present invention.

The following truth table shows a relationship between mode address signals MA7, MA8 and the frequency of external clock signal ECLK.

| MA8 | MA7 | Frequency of ECLK |
|---|---|---|
| 0 | 0 | Less than 83 MHz |
| 0 | 1 | 83–90 MHz |
| 1 | 0 | 90–125 MHz |
| 1 | 1 | 125 MHz or more |

As shown in the table, when the frequency of external clock signal ECLK is less than 83 MHz, "0" is set as mode address signal MA7 and "0" is set as mode address signal MA8. When the frequency of external clock signal ECLK is 83 MHz or more but less than 90 MHz, "1" is set as mode address signal MA7 and "0" is set as mode address signal MA8. When the frequency of external clock signal ECLK is 90 MHz or more but less than 125 MHz, "0" is set as mode address signal MA7 and "1" is set as mode address signal MA8. Further, when the frequency of external clock signal ECLK is 125 MHz or more, "1" is set as mode address signal MA7 and "1" is set as mode address signal MA8.

Data input/output buffer 11 includes sixteen CMOS type inverters as shown in FIG. 3, and outputs 16-bit data signals DQ0–DQ15 by inverting 16-bit output signal VOUT. These inverters each include a transistor element 110 formed of three P channel MOS transistors 1, 111, 112, an N channel MOS transistor 2, and an inverter 113 inverting 1-bit output signal VOUT to output 1-bit output signal /VOUT.

P channel MOS transistors 1, 112, 111 are connected in parallel between an external power supply node 3 receiving an external power supply voltage EVCC and an output node 4. The N channel MOS transistor is connected between a ground node 6 receiving a ground voltage GND and output node 4. Output signal Vout is supplied to the gates of P channel MOS transistor 1 and N channel MOS transistor 2. Here, the size (more specifically, gate width) of P channel MOS transistor 111 is designed to be larger than the size of P channel MOS transistor 112.

The SDRAM further includes two NAND circuits 17, 18 to change the current supplying capability of transistor element 110 in response to mode address signals MA7, MA8 which are set in the mode register. NAND circuit 17 receives output signal /VOUT from inverter 113 and mode address signal MA8 from mode register 15, and the output signal of NAND circuit 17 is supplied to the gate of P channel MOS transistor 111. NAND circuit 18 receives output signal /VOUT from inverter 113 and mode address signal MA7 from mode register 15, and the output signal of NAND circuit 18 is supplied to the gate of P channel MOS transistor 112.

Therefore, when mode address signals MA8 and MA7 are both at the L level (when the frequency of external clock signal ECLK is less than 83 MHz), P channel MOS transistors 111 and 112 are both turned off and inactivated, and P channel MOS transistor 1 is activated. When mode address signal MA8 and mode address signal MA7 are at the L level and the H level, respectively (when the frequency of external clock signal ECLK is 83–90 MHz), P channel MOS transistor 111 is turned off and inactivated, and P channel MOS transistors 110 and 112 are activated. When mode address signal MA8 and mode address signal MA7 are at the H level and the L level, respectively (when the frequency of external clock signal ECLK is 90–125 MHz), P channel MOS transistor 112 is turned off and inactivated, and P channel MOS transistors 110 and 111 are activated. Further, when mode address signal MA8 and mode address signal MA7 are both at the H level (when the frequency of external clock signal ECLK is 125 MHz or more), all P channel MOS transistors 1, 111, 112 are activated.

Since P channel MOS transistor 111 is larger than P channel MOS transistor 112 in size, the current supplying capability of transistor element 110 is raised as the frequency of external clock signal ECLK becomes higher. In other words, in the first embodiment, mode register 15 and NAND circuits 17, 18 change the current supplying capability of transistor element 110 by changing the effective size (more specifically, effective gate width) of transistor element 110 in accordance with the frequency of external clock signal ECLK.

Then, the operation of the SDRAM structured as above will be described with reference to a timing chart shown in FIG. 4.

If chip selection signal /CS, row address strobe signal /RAS, write enable signal /WE are at the L level and column address strobe signal /CAS is at the H level when external clock signal ECLK rises from the L level to the H level, the timing indicates a mode setting command. Thus, command decoder 131 activates mode setting signal /MSET to the L level. Since clocked inverter 133 is activated in response to L level mode setting signal /MSET, internal address signal IAn (n=0–12) supplied from address buffer 14 is then supplied to mode register 15 as mode address signal MAn (n=0–12).

When the frequency of external clock signal ECLK is less than 83 MHz, external address signals IA8 and IA7 are both at the L level, and thus mode address signals MA8 and MA7 are both set at the L level. When the frequency of external clock signal ECLK is 83–90 MHz, internal address signal IA8 and internal address signal IA7 are at the L level and the H level, respectively, and thus mode address signal MA8 is set at the L level and mode address signal MA7 is set at the H level. When the frequency of external clock signal is 90–125 MHz, internal address signal IA8 and internal address signal IA7 are at the H level and the L level, respectively, and thus mode address signal MA8 is set at the H level and mode address signal MA7 is set at the L level. Further, when the frequency of external clock signal ECLK is 125 MHz or more, internal address signals IA8 and IA7 are both at the H level, and thus mode address signals MA8 and MA7 are both set at the H level.

When mode address signals MA8 and MA7 are both set at the L level (when the frequency of external clock signal ECLK is less than 83 MHz), P channel MOS transistor is activated and P channel MOS transistors 111 and 112 are inactivated. When mode address signal MA8 is set at the L level and mode address signal MA7 is set at the H level (when the frequency of external clock signal ECLK is 83–90 MHz), P channel MOS transistors 1 and 112 are activated and P channel MOS transistor 111 is inactivated. When mode address signal MA8 is set at the H level and mode address signal MA7 is set at the L level (when the frequency of external clock signal ECLK is 90–125 MHz), P channel MOS transistors 1 and 111 are activated and P channel MOS transistor 112 is inactivated. Further, when mode address signals MA8 and MA7 are both set at the H level (when the frequency of external clock signal ECLK is 125 MHz or more), all P channel MOS transistors 1, 111, 112 are activated.

Since P channel MOS transistor is larger than P channel MOS transistor 112 in size, the current supplying capability of transistor element 110 is raised as the frequency of external clock signal ECLK becomes higher. Therefore, when the frequency of external clock signal ECLK is as high as 125 MHz or more, transistor element 110 supplies sufficient current to output node 4. Thus, data signals DQ0–DQ15 which are output from output buffer circuit 11 can sufficiently follow external clock signal ECLK having the high frequency. On the other hand, when the frequency of external clock signal ECLK is as low as less than 83 MHz, the current supplying capability of transistor element 110 is lowered. Thus, a ringing phenomenon becomes less possible in data signals DQ0–DQ15 which are output from output buffer circuit 11.

As described above, according to the first embodiment, a signal which corresponds to an external clock signal is set in mode register 15, and P channel MOS transistors 1, 111, 112 are selectively activated in accordance with the set signal. Thus, the current supplying capability of transistor element 110 changes in accordance with the frequency of external clock signal ECLK. Therefore, even when the frequency of external clock signal ECLK is as low as less than 83 MHz, the ringing phenomenon is less possible in data signals DQ0–DQ15. Accordingly, power consumption is also reduced.

[Second Embodiment]

Figure 5:
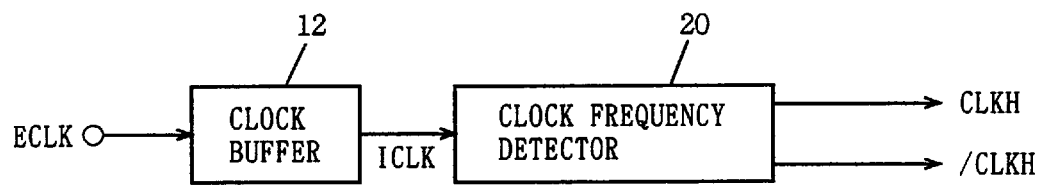
FIG. 5 is a block diagram showing a structure of a main part of a SDRAM in accordance with a second embodiment of the present invention.

FIG. 5 is a block diagram showing a structure of a main part of an SDRAM according to a second embodiment of the present invention. Referring to FIG. 5, the SDRAM includes, instead of mode register 15 shown in FIG. 1, a clock frequency detector 20 detecting the frequency of internal clock signal ICLK from clock buffer 12 and outputting a control signal CLKH and an complementary control signal /CLKH in accordance with the detected frequency. Clock frequency detector 20 compares the frequency of internal clock signal ICLK with the frequency of a reference clock signal which is generated inside. When the frequency of internal clock signal ICLK is higher than the frequency of the reference clock signal, clock frequency detector 20 outputs H level control signal CLKH and L level control signal /CLKH. On the contrary, when the frequency of internal clock signal ICLK is lower than the frequency of the reference clock signal, clock frequency detector 20 outputs L level control signal CLKH and H level control signal /CLKH. Here, the specific circuit structure and operation of clock frequency detector 20 will be described below in detail with reference to FIGS. 7 and 8.

Figure 6:
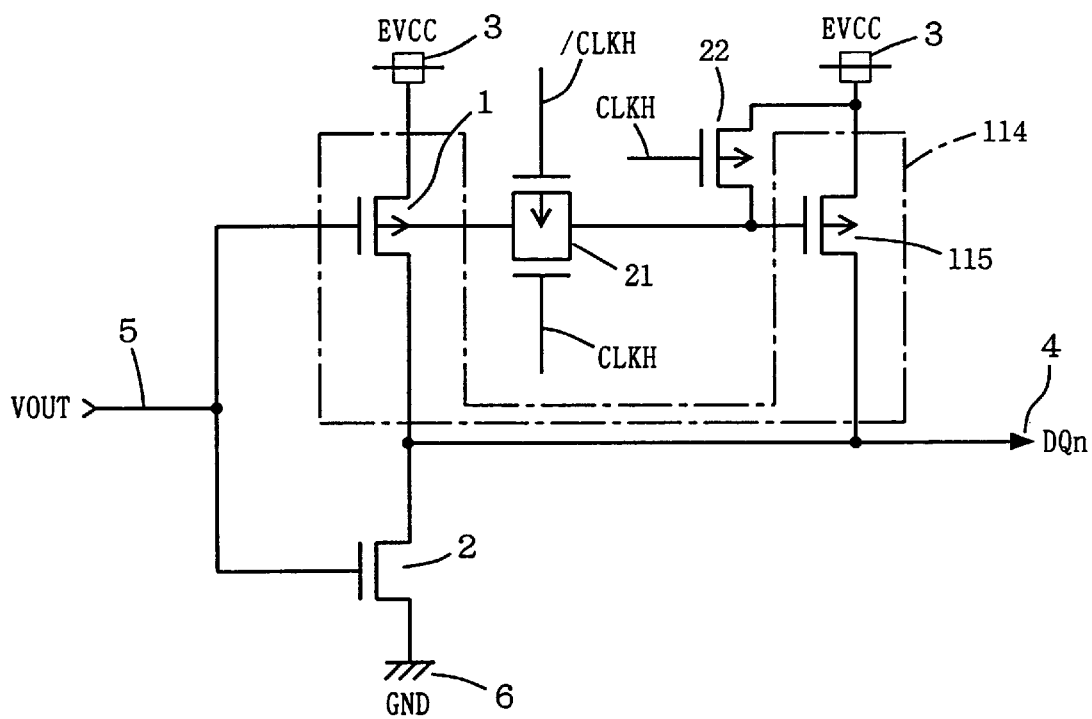
FIG. 6 is a circuit diagram showing structures of an output buffer circuit and its control circuitry in the SDRAM shown in FIG. 5.

FIG. 6 is a circuit diagram showing a structure of each CMOS type inverter included in the data input/output buffer in the SDRAM according to the second embodiment. Referring to FIG. 6, unlike transistor element 110 shown in FIG. 3, a transistor element 114 of inverter 10 includes two P channel MOS transistors 1, 115. Two P channel MOS transistors 1, 115 are connected in parallel between external power supply node 3 and output node 4.

The SDRAM includes a transfer gate 21 and a P channel MOS transistor 22 to change the current supplying capability of transistor element 114 in response to control signals CLKH and /CLKH which are output from clock frequency detector 20. When control signals CLKH and /CLKH are at the H level and the L level, respectively, transfer gate 21 is turned on and it supplies output signal VOUT which is read out of the memory cell array to the gate of P channel MOS transistor 115. P channel MOS transistor 22 is connected between external power supply node 3 and the gate of P channel MOS transistor 115, and turned on in response to L level control signal CLKH.

Therefore, when control signals CLKH and /CLKH are at the H level and the L level, respectively (when the frequency of internal clock signal ICLK is higher), P channel MOS transistors 1 and 115 are both activated, and thus the supplying capability of transistor element 114 is raised. On the contrary, when the control signals CLKH and /CLKH are at the L level and the H level, respectively (when the frequency of internal clock signal ICLK is lower), P channel MOS transistor 1 is activated and P channel MOS transistor 115 is inactivated. Although the gate of P channel MOS transistor 115 is disconnected from input node 5 by transfer gate 21 at this time, P channel MOS transistor 22 is on, so that it attains the H level rather than a floating state. As a result, the current supplying capability of transistor element 114 is lowered.

In the second embodiment, therefore, clock frequency detector 20 and transfer gate 21 change the current supplying capability of transistor element 114 by controlling the output buffer circuit in accordance with the frequency of external clock signal ECLK.

Thus, since the current supplying capability of transistor element 114 is raised when the frequency of internal clock signal ICLK is high, data signal DQn which is output from the output buffer circuit can sufficiently follow internal clock signal ICLK having the high frequency. When the frequency of internal clock signal ICLK is low, however, the current supplying capability of transistor element 114 is lowered and thus the ringing phenomenon is less possible in data signal DQn. Accordingly, power consumption is also reduced.

As described above, the frequency of internal clock signal ICLK is detected by clock frequency detector 20, and P channel MOS transistors 1 and 115 are selectively activated in accordance with the detected frequency. Thus, the current supplying capability of transistor element 114 is automatically changed in accordance with the frequency of external clock signal ECLK. Accordingly, there will be no trouble of setting a mode as in the first embodiment.

Figure 7:
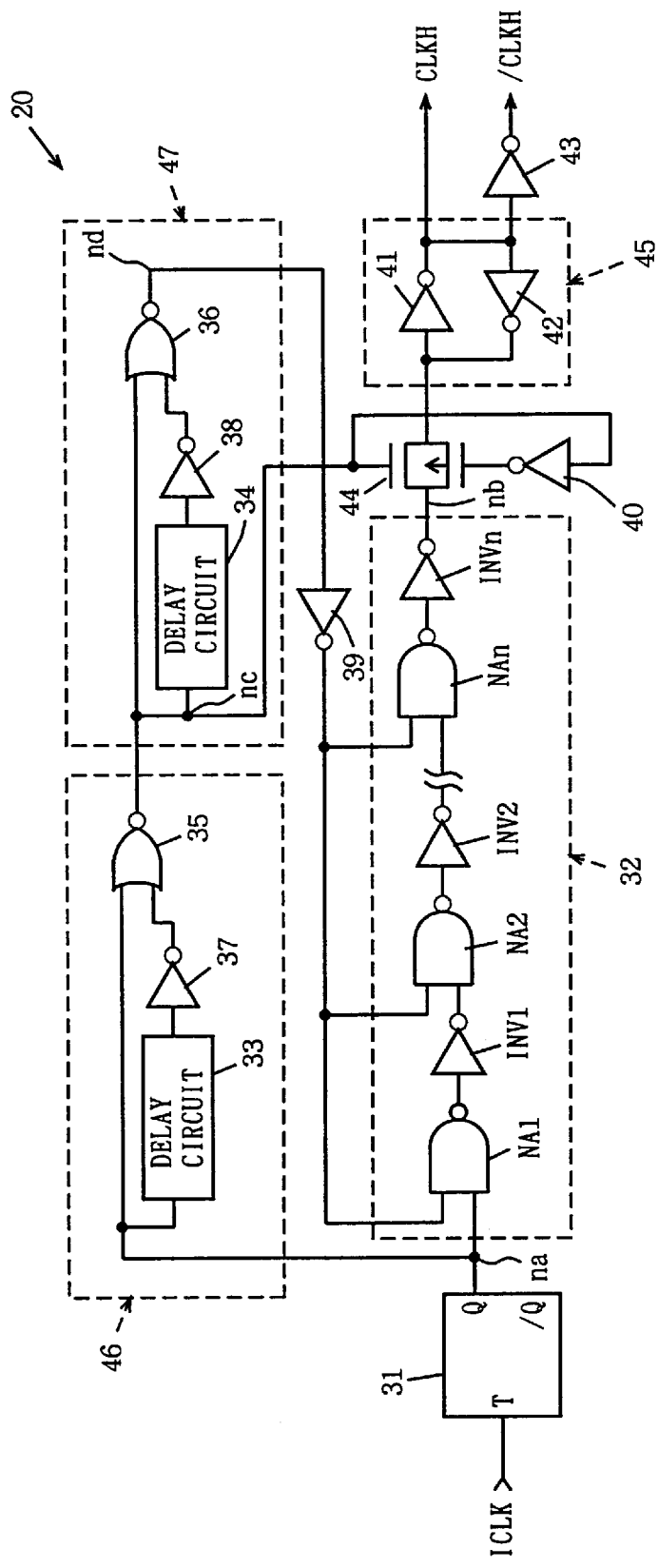
FIG. 7 is a circuit diagram showing a specific structure of the clock frequency detector shown in FIG. 5.

Here, one example of clock frequency detector 20 will be described with reference to FIG. 7. Referring to FIG. 7, clock frequency detector 20 includes a T flipflop 31, delay circuits 32, 33, 34, NOR circuits 35, 36, inverter circuits 37-43, and a transfer gate 44. Further, delay circuit 32 includes n (n is a natural number) NAND circuits NA1–NAn and n inverters INV1–INVn.

In delay circuit 32, the output node of NAND circuit NA1 is connected to the input node of inverter INV1, and the output node of inverter INV1 is connected to one input node of NAND circuit NA2. Similarly, the output node of NAND circuit NA2 is connected to the input node of inverter INV2, and the output node of inverter INV2 is connected to one input node of NAND circuit NA3. In a similar manner, n NAND circuits and n inverters are alternately connected in series. One input node na of NAND circuit NA1 is connected to the non-inverted output node Q of T flipflop 31. Further, the output node of the nth inverter INVn is connected to the input node nb of transfer gate 44.

Meanwhile, the output node of delay circuit 33 is connected to the input node of inverter 37, and the output node of inverter 37 is connected to one input node of NOR circuit 35. The input node of delay circuit 33 and the other input node of NOR circuit 35 are connected to input node na of NAND circuit NA1. Similarly, the output node of delay circuit 34 is connected to the input node of inverter 38, and the output node of inverter 38 is connected to one input node of NOR circuit 36. The input node of delay circuit 34 and the other input node of NOR circuit 36 are connected to the output node nc of NOR circuit 35. Further, the output node of NOR circuit 36 is connected to the input node nd of inverter 39. The output node of inverter 39 is connected to the other input node of each of NAND circuits NA1–NAn.

Output node nc of NAND circuit 35 is connected to the gate of an N channel MOS transistor forming a transfer gate 44 and the input node of inverter 40, and the output node of inverter 40 is connected to the gate of a P channel MOS transistor forming a transfer gate 44. Inverters 41 and 42 have their input nodes and output nodes interconnected to form a latch circuit 45, and the input node of latch circuit 45 is connected to the output node of transfer gate 44. Latch circuit 45 outputs control signal CLKH and also outputs control signal /CLKH through inverter 43.

Delay circuit 33, NOR circuit 35 and inverter circuit 37 form a monostable multivibrator 46. Similarly, delay circuit 34, NOR circuit 36 and inverter 38 form a monostable multivibrator 47. The input node T of T flipflop 31 is connected to clock buffer 12 to receive internal clock signal ICLK. T flipflop 31 is a circuit for inverting the level of an output signal at the rising of internal clock signal ICLK which is received.

Figure 8:
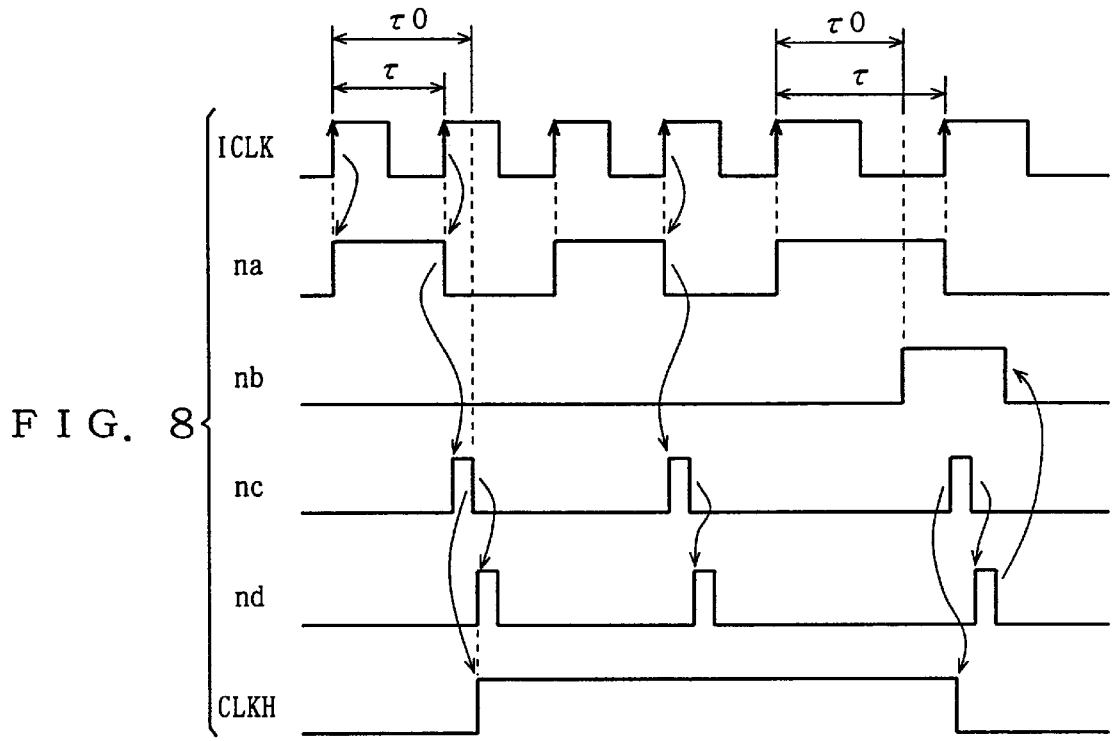
FIG. 8 is a timing chart illustrating the operation of the clock frequency detector shown in FIG. 7.

FIG. 8 is a timing chart illustrating the operation of clock frequency detector shown in FIG. 7. Referring to FIG. 8, the operation of clock frequency detector 20 will be described.

It is assumed in FIG. 8 that the delay time by delay circuit 32 is $\tau 0$ and the cycle of internal clock signal ICLK is $\tau$. Node na of NAND circuit NA1 attains the H level when internal clock signal ICLK rises, and node na attains the L level after time $\tau$. Since node na lowers from the H level to the L level, a one-shot pulse signal is generated at node nc of NOR circuit 35.

When $\tau < \tau 0$, the H level one-shot pulse is generated at node nc and transfer gate 44 is turned on and rendered conductive and then turned off and rendered non-conductive before the H level of node na is transmitted to node nb of transfer gate 44. Therefore, the input of latch circuit 45, control signal CLKH from clock frequency detector 20 and control signal /CLKH attain the L level, the H level, and the L level, respectively. When $\tau \geq \tau 0$, however, the H level one-shot pulse signal is generated at node nc and transfer gate 44 is turned on and rendered conductive and then turned off and rendered non-conductive after the H level of node na is transmitted to node nb. Therefore, the input of latch circuit 45, control signal CLKH from clock frequency detector 20, and control signal /CLKH attain the H level, the L level, and the H level, respectively.

In short, clock frequency detector 20 outputs L level control signal CLKH and H level control signal /CLKH when the frequency of internal clock signal ICLK which is input from clock buffer 12 is not more than a prescribed frequency, and outputs H level control signal CLKH and L level control signal /CLKH when the frequency of internal clock signal ICLK exceeds the prescribed frequency. Here, monostable multivibrator 47 outputs a signal for resetting a pulse signal which remains in delay circuit 32 after transfer gate 44 is opened and closed by the one-shot pulse signal which is output by monostable multivibrator 46.

[Third Embodiment]

Figure 9:
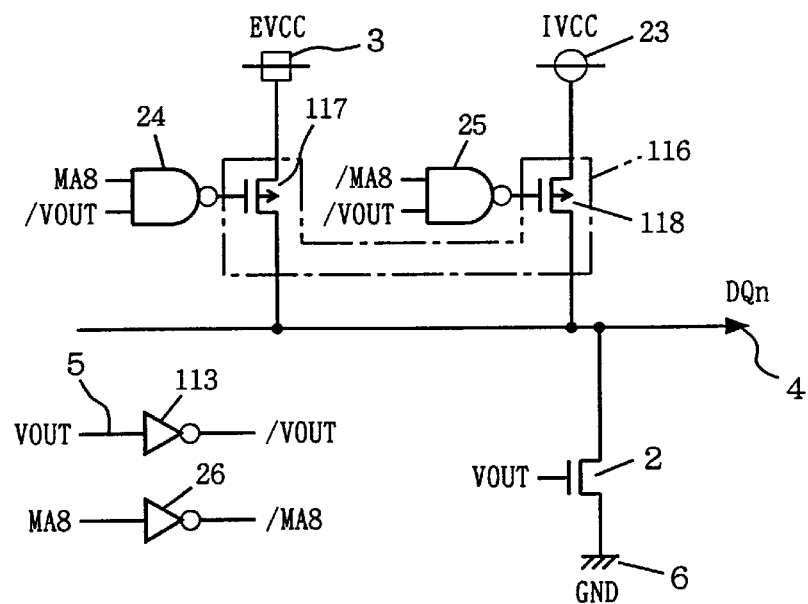
FIG. 9 is a circuit diagram showing structures of an output buffer circuit and its control circuitry in an SDRAM according to a third embodiment of the present invention.

FIG. 9 is a circuit diagram showing a structure of a main part in an SDRAM according to a third embodiment of the present invention. Referring to FIG. 9, the output buffer circuit in the SDRAM includes a transistor element 116 instead of transistor element 110 shown in FIG. 3. Transistor element 116 includes two P channel MOS transistors 117, 118. P channel MOS transistor 117 is connected between external power supply node 3 receiving external power supply voltage EVCC and output node 4. P channel MOS transistor 118 is connected between an internal power supply node 23 receiving an internal power supply voltage IVCC (generated by an internal power supply down converter circuit shown in FIG. 10 described below) lower than external power supply voltage EVCC and output node 4.

Instead of NAND circuits 17, 18 shown in FIG. 3, the SDRAM further includes two NAND circuits 24, 25 and an inverter 26. NAND circuit 24 receives mode address signal MA8 which is set in mode register 15 shown in FIG. 2 and an output signal /VOUT from an inverter 113, and the output signal of NAND circuit 24 is supplied to the gate of P channel MOS transistor 117. NAND circuit 25 receives an inverted signal /MA8 inverted with respect to mode address signal MA8 and output signal /VOUT from inverter 113, and the output signal of NAND circuit 25 is supplied to the gate of P channel MOS transistor 118. Inverted signal /MA8 is generated by an inverter 26 which receives mode address signal MA8.

In the third embodiment, H level mode address signal MA8 is set in mode register 15 when the frequency of external clock signal ECLK is high. In this case, therefore, P channel MOS transistor 117 is activated and P channel MOS transistor 118 is inactivated. On the other hand, when the frequency of external clock signal ECLK is low, L level mode address signal MA8 is set in mode register 15. In this case, therefore, P channel MOS transistor 118 is activated and P channel MOS transistor 117 is inactivated.

Figure 10:
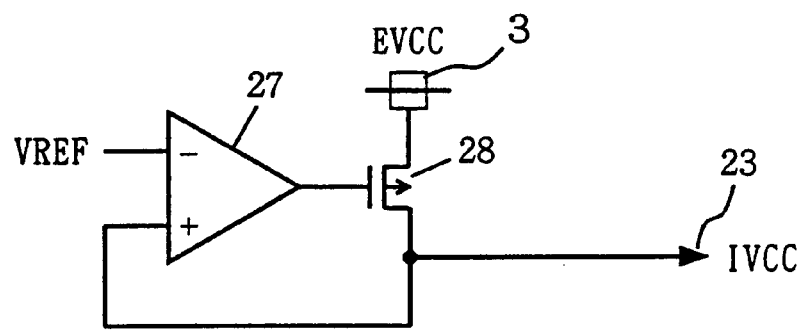
FIG. 10 is a circuit diagram showing a structure of an internal power supply down converter circuit in the SDRAM shown in FIG. 9.
Figure 11:
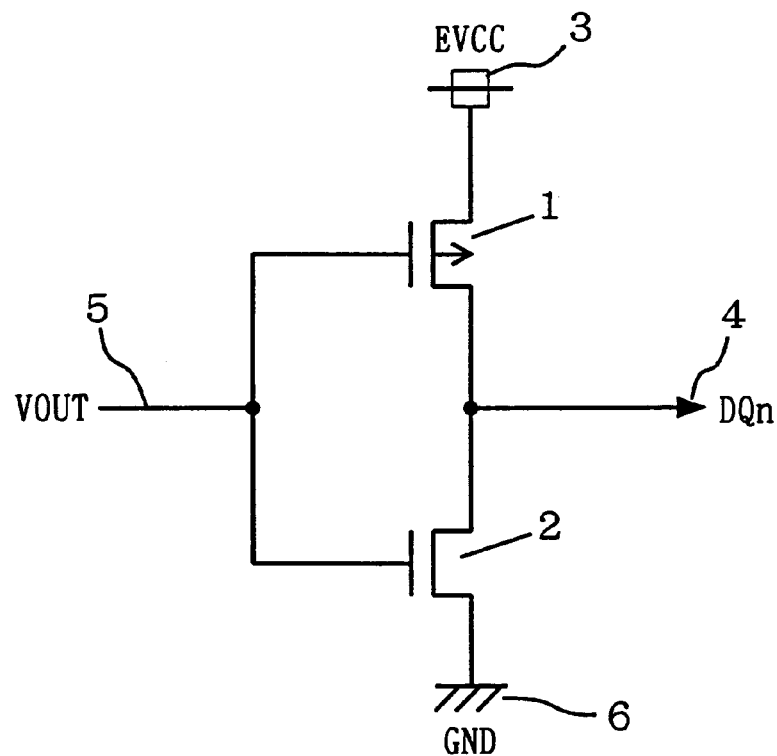
FIG. 11 is a circuit diagram showing a structure of an output buffer circuit in a conventional SDRAM.

The SDRAM further includes the internal power supply down converter circuit as shown in FIG. 10. The internal power supply down converter circuit includes a differential amplifier 27 and a P channel MOS transistor 28. Differential amplifier 27 receives an internally generated constant reference voltage VREF at its inverted input terminal (−) and internal power supply voltage IVCC at its non-inverted input terminal (+). P channel MOS transistor 28 is connected between external power supply node 3 and internal power supply node 23 and controlled in response to the output signal of differential amplifier 27. In other words, differential amplifier 27 controls P channel MOS transistor 28 so that internal power supply voltage IVCC which is fed back from internal power supply node 23 is equalized with reference voltage VREF. Since reference voltage VREF is set to be lower than external power supply voltage EVCC, internal power supply voltage IVCC generated by the internal power supply down converter circuit is also lower than external power supply voltage EVCC.

As described above, when the frequency of external clock signal ECLK is high, P channel MOS transistor 117 receiving external power supply voltage EVCC is activated, and thus the current supplying capability of transistor element 116 is raised. When the frequency of external clock signal ECLK is low, however, P channel MOS transistor 118 receiving internal power supply voltage IVCC is activated, and thus the current supplying capability of transistor element 116 is lowered.

Therefore, in the third embodiment, mode register 15, NAND circuits 24, 25, and inverter 26 change the current supplying capability of transistor element 116 in accordance with the frequency of external clock signal ECLK.

As described above, according to the third embodiment of the present invention, when the frequency of external clock signal ECLK is low, P channel MOS transistor 118 receiving internal power supply voltage IVCC is activated, and thus the current supplying capability of transistor element 116 is lowered. Therefore, a ringing phenomenon becomes less possible in data signal DQn.

Although the present invention has been described with respect to the various embodiments described above, the present invention can also be implemented in other manners. In the first to third embodiments described above, the current supplying capability (size) of transistor elements 110, 114, 116 is changed by controlling P channel MOS transistors 111, 112, 115, 117, 118. Instead, a plurality of N channel MOS transistors may be connected in parallel between output node 4 and ground node 6 and they may be controlled in order to change the current supplying capability of a transistor element.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device operating in synchronization with a clock signal, comprising:

an output buffer circuit including parallel connected transistor elements outputting a data signal; and controlling means for controlling said output buffer circuit in accordance with a frequency of said clock signal to change current supplying capability of said parallel connected transistor elements.

2. The semiconductor circuit device according to claim 1, wherein said transistor elements include a plurality of first conductivity type transistors connected in parallel between a first power supply node and an output node of said output buffer circuit, said changing means includes activating means for selectively activating said plurality of first conductivity type transistors in response to the signal which is set in said register, and said output buffer circuit further includes a second conductivity type transistor connected between a second power supply node and said output node.

3. The semiconductor circuit device according to claim 2, wherein said controlling means includes a register in which a desired signal can be set, and changing means for changing the current supplying capability of said transistor elements in response to the signal which is set in said register.

4. The semiconductor circuit device according to claim 2, wherein said controlling means includes detecting means for detecting the frequency of said clock signal and outputting a control signal in accordance with the detected frequency, and changing means for changing the current supplying capability of said transistor elements in response to the control signal which is output from said detecting means.

5. The semiconductor circuit device according to claim 4, wherein said transistor elements include a plurality of first conductivity type transistors connected in parallel between a first power supply node and an output node of said output buffer circuit, said changing means includes activating means for selectively activating said plurality of first conductivity type transistors in response to the control signal which is output from said detecting means, and said output buffer circuit further includes a second conductivity type transistor connected between a second power supply node and said output node.

6. The semiconductor circuit device according to claim 1, further comprising:

a down converter circuit down-converting an external power supply voltage to generate an internal power supply voltage, wherein said transistor elements include a first P channel MOS transistor connected between an external power supply node receiving said external power supply voltage and an output node of said output buffer circuit, and a second P channel MOS transistor connected between an internal power supply node receiving said internal power supply voltage and said output node, said controlling means includes activating means for activating said first or second P channel MOS transistor in accordance with the frequency of said clock signal, and said output buffer circuit further includes an N channel MOS transistor connected between a ground node and said output node.

7. A method of using a semiconductor circuit device operating in synchronization with a clock signal, said semiconductor circuit device including an output buffer circuit having parallel connected transistor elements outputting a data signal, a register in which a desired signal can be set, and changing means for changing current supplying capability of said transistor elements in response to the signal which is set in said register, comprising the steps of:

setting said register into a mode in which said desired signal can be set in said register; and setting the signal corresponding to the frequency of said clock signal in said register.

8. A synchronous semiconductor memory device operating in synchronization with a clock signal, comprising:

a memory cell array;

an output buffer circuit including a transistor element outputting a data signal read out from said memory cell array; and controlling means for controlling said output buffer circuit in accordance with a frequency of said clock signal to change current supplying capability of said transistor element.

9. The synchronous semiconductor memory device according to claim 8, wherein said controlling means includes a register in which a desired signal can be set, and changing means for changing the current supplying capability of said transistor element in response to the signal which is set in said register.

10. The synchronous semiconductor memory device according to claim 9, wherein said transistor element includes a plurality of first conductivity type transistors connected in parallel between a first power supply node and an output node of said output buffer circuit, said changing means includes activating means for selectively activating said plurality of first conductivity type transistors in response to the signal which is set in said register, and said output buffer circuit further includes a second conductivity type transistor connected between a second power supply node and said output node.

11. The synchronous semiconductor memory device according to claim 8, wherein said controlling means includes detecting means for detecting the frequency of said clock signal and outputting a control signal in accordance with the detected frequency, and changing means for changing the current supplying capability of said transistor element in response to the control signal which is output from said detecting means.

12. The synchronous semiconductor memory device according to claim 11, wherein said transistor element includes a plurality of first conductivity type transistors connected in parallel between a first power supply node and an output node of said output buffer circuit, said changing means includes activating means for selectively activating said plurality of first conductivity type transistors in response to the control signal which is output from said detecting means, and said output buffer circuit further includes a second conductivity type transistor connected between a second power supply node and said output node.

13. The synchronous semiconductor memory device according to claim 8, further comprising:

a down converter circuit down-converting an external power supply voltage to generate an internal power supply voltage, wherein said transistor element includes a first transistor connected between an external power supply node receiving said external power supply voltage and an output node of said output buffer circuit, and a second transistor connected between an internal power supply node receiving said internal power supply voltage and said output node, said controlling means includes activating means for activating said first or second transistor in accordance with the frequency of said clock signal, and said output buffer circuit further includes a third transistor connected between a ground node and said output node.

14. The synchronous semiconductor memory device according to claim 13, wherein said first transistor has a first gate width, and said second transistor has a second gate width larger than said first gate width.

15. The synchronous semiconductor memory device according to claim 8, wherein said transistor element includes a plurality of transistors connected in parallel between a power supply node and an output node of said output buffer circuit, and said controlling means switches the number of said transistors.

* * * * *